United States Patent
Hsu et al.

(10) Patent No.: US 9,257,498 B1
(45) Date of Patent: Feb. 9, 2016

(54) PROCESS TO IMPROVE PERFORMANCE FOR METAL-INSULATOR-METAL (MIM) CAPACITORS

(71) Applicant: Taiwan Semiconductor Manufacturing Co., Ltd., Hsin-Chu (TW)

(72) Inventors: Chern-Yow Hsu, Chu-Bei (TW); Shih-Chang Liu, Alian Township (TW); Ching-Sheng Chu, Baoshan Township (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/450,532

(22) Filed: Aug. 4, 2014

(51) Int. Cl.
| | | |
|---|---|---|
| *H01L 27/108* | (2006.01) | |
| *H01L 29/94* | (2006.01) | |
| *H01L 49/02* | (2006.01) | |
| *H01L 21/3213* | (2006.01) | |
| *H01L 21/283* | (2006.01) | |
| *H01L 21/321* | (2006.01) | |

(52) U.S. Cl.
CPC .............. *H01L 28/60* (2013.01); *H01L 21/283* (2013.01); *H01L 21/321* (2013.01); *H01L 21/32133* (2013.01)

(58) Field of Classification Search
USPC ........................................................ 257/303
See application file for complete search history.

(56) References Cited

U.S. PATENT DOCUMENTS

| | | | |
|---|---|---|---|
| 6,114,051 A * | 9/2000 | Timmer et al. | 428/626 |
| 6,334,964 B1 | 1/2002 | Cowman et al. | |
| 6,759,703 B1 | 7/2004 | Matsuhashi | |
| 6,812,088 B1 | 11/2004 | Chen et al. | |
| 6,821,839 B2 | 11/2004 | Chung | |
| 7,078,785 B2 | 7/2006 | Ciancio et al. | |
| 7,335,569 B2 | 2/2008 | Senzaki | |
| 2002/0071237 A1* | 6/2002 | Adler | 361/302 |
| 2004/0169211 A1* | 9/2004 | Zhuang et al. | 257/295 |
| 2005/0062130 A1 | 3/2005 | Ciancio et al. | |
| 2006/0145293 A1 | 7/2006 | Cho | |

(Continued)

OTHER PUBLICATIONS

Yang-Kyu Choi, et al.; "Investigation of Gate-Induced Drain Leakage (GIDL) Current in Thin Body Devices: Single-Gate Ultra-Thin Body, Symmetrical Double-Gate, and Asymmetrical Double-Gate MOSFETs"; Jpn. J. Appl. Phys. vol. 42 (2003), p. 2073-2076.
U.S. Appl. No. 14/230,204, filed Mar. 31, 2014.
U.S. Appl. No. 14/591,981, filed Jan. 8, 2015.

(Continued)

*Primary Examiner* — Asok K Sarkar
(74) *Attorney, Agent, or Firm* — Eschweiler & Associates, LLC

(57) ABSTRACT

Some embodiments relate to a metal-insulator-metal (MIM) capacitor, which includes a capacitor a capacitor bottom metal (CBM) electrode, a high k dielectric layer arranged over the CBM electrode, and a capacitor top metal (CTM) electrode arranged over the high k dielectric layer. In some embodiments, the MIM capacitor comprises CTM protective sidewall regions, which extend along vertical sidewall surfaces of the CTM electrode, and protect the CTM electrode from leakage, premature voltage breakdown, or burn out, due to metallic residue or etch damage formed on the sidewalls during one or more etch process(es) used to form the CTM electrode. In some embodiments, the MIM capacitor comprises CBM protective sidewall regions, which extend along vertical sidewall surfaces of the CBM electrode. In some embodiments, the MIM capacitor comprises both CBM and CTM protective sidewall regions.

20 Claims, 6 Drawing Sheets

(56) References Cited

U.S. PATENT DOCUMENTS

| | | |
|---|---|---|
| 2006/0183280 A1 | 8/2006 | Lee et al. |
| 2006/0292815 A1 | 12/2006 | Roberts et al. |
| 2007/0034924 A1 | 2/2007 | Takewaki et al. |
| 2008/0318378 A1 | 12/2008 | Wu et al. |
| 2009/0014835 A1 | 1/2009 | Furumiya et al. |
| 2011/0227195 A1 | 9/2011 | Horng et al. |
| 2014/0264751 A1 | 9/2014 | Chen et al. |

OTHER PUBLICATIONS

Deok-Sin Kil, et al., "Improvement of Leakage Current Property of TIT Capacitor with Compositionally Stepped $Hf_xAl_yO_z$ Thin Films," Electronic Materials Letters, vol. 2, No. 1, p. 15-18, 2006.

Non Final Office Action Dated Oct. 30, 2015 U.S. Appl. No. 14/591,981.

Non Final Office Action Dated Dec. 4, 2015 U.S. Appl. No. 14/230,204.

* cited by examiner

PROCESS TO IMPROVE PERFORMANCE FOR METAL-INSULATOR-METAL (MIM) CAPACITORS

BACKGROUND

A capacitor is a passive two-terminal electrical device used to store energy within an electric field, and contains at least two electrodes separated by a dielectric layer. A capacitance of the capacitor is proportional to an area between the electrodes, and inversely proportional to a distance between them, (also a thickness of the dielectric layer). Accordingly, the capacitance can be increased by increasing the area between the electrodes, or decreasing the distance between them.

Capacitors not only store electric charge, but also block direct current (DC) while allowing alternating current (AC) to pass. Some examples of capacitors include deep trench (DT) capacitors and metal-insulator-metal (MIM) capacitors. DT capacitors are formed directly within a substrate, while MIM capacitors are formed on back end of line (BEOL) metallization layers.

In some circuit applications, decoupling capacitors (DE-CAPS) are utilized to decouple one part of an electrical network from another. In some RF and analog device applications, an array of MIM capacitors may be utilized. For instance, gain amplifiers, equalizers, filter circuits, and analog-to-digital converters include an array of programmable capacitors, which may be formed by MIM capacitors. In such applications, matching of device characteristics between the various MIM capacitors of the array is critical to device functionality.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
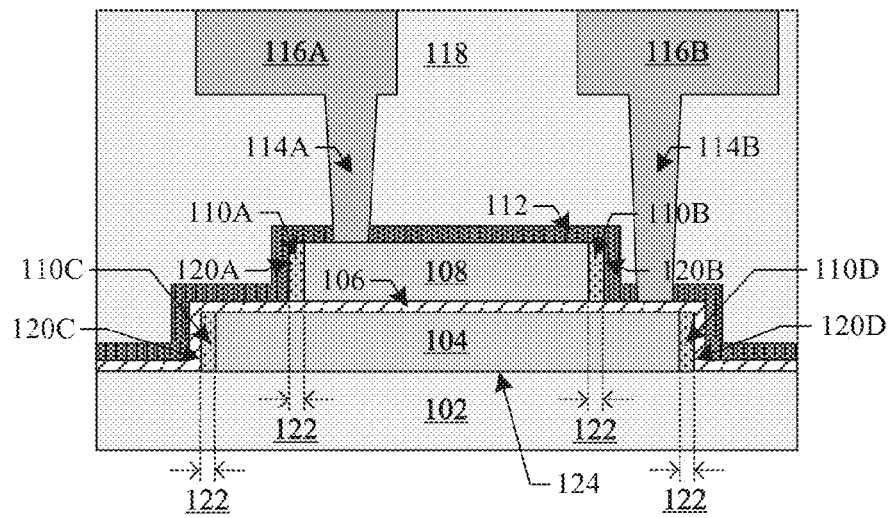
FIGS. 1A-1C illustrate cross-sectional views of MIM capacitors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A shows a cross-sectional view of a metal-insulator-metal (MIM) capacitor 100A, which has been formed in accordance with some embodiments. The MIM capacitor 100A includes a capacitor bottom metal (CBM) electrode 104, a high k dielectric layer 106 arranged over the CBM electrode 104, and a capacitor top metal (CTM) electrode 108 arranged over the high k dielectric layer 106.

As has been appreciated in the present disclosure, conventional MIM capacitors are susceptible to failure modes due to leakage between CBM and CTM electrodes 104, 108, premature voltage breakdown within the high k dielectric layer 106, or burn out. These failure modes can be caused for example by metallic residue on CTM vertical sidewall surfaces 120A, 120B, or damage to the CTM vertical sidewall surfaces 120A, 120B, resulting from an etch used to form the CTM electrode 108. Metallic residue or etch damage to CBM vertical sidewall surfaces 120C, 120D can have a similar effect. More particularly, the metallic residue or etch damage can lead to shorts or narrow vertical pathways in outer edges of the high k dielectric layer 106 between the CBM and CTM electrodes 104, 108. Hence, when a voltage is applied across the CBM and CTM electrodes 104, 108 during normal operation of the MIM capacitor 100A, the voltage can tend to surge through these shorts or narrow pathways, causing leakage, premature voltage failure, or burn out of the MIM capacitor 100A. Moreover, for an integrated circuit (IC) containing an array of MIM capacitors, this metallic residue or etch damage may only occur for a fraction of the MIM capacitors within the array due to small manufacturing variation between the MIM capacitors. As a result, the precise nature of this problem had been difficult to understand, let alone mitigate.

To protect the MIM capacitor 100A from leakage, premature voltage breakdown, or burn out, the MIM capacitor 100A includes CTM protective sidewall regions 110A, 110B, which extend along and beneath the CTM vertical sidewall surfaces 120A, 120B. CBM protective sidewall regions 110C, 110D are similarly formed along and beneath CBM vertical sidewall surfaces 120C, 120D.

The CTM protective sidewall regions 110A, 110B, and CBM protective sidewall regions 110C, 110D, comprise oxidation or nitridation layers, which are formed through a plasma treatment of other thermal process(es). The CTM protective sidewall regions 110A, 110B act as barriers or buffers to prevent or limit metallic residue from the CTM vertical sidewall surfaces 120A, 120B from damaging the high k dielectric layer 106. The CTM protective sidewall regions 110A, 110B, also act as barriers or buffers to prevent damage to the CTM vertical sidewall surfaces 120A, 120B, and to prevent corresponding damage-susceptibility to the high k dielectric layer 106 when an etch is used to form the CTM electrode 108. The CBM protective sidewall regions 110C, 110D similarly protect the CBM electrode 104 and the high k dielectric layer 106.

In some embodiments, the CBM electrode 104 is made of a first material that includes a metallic component, and the CBM protective sidewall regions 110C, 110D are made of a second material that includes the metallic component and an oxide or nitride component. For example, the CBM electrode 104 can comprise titanium, and CBM protective sidewall regions 110C, 110D can comprise titanium oxide. The CTM electrode 108 and the CTM protective sidewall regions 110A, 110B are similarly composed. In various embodiments, the CBM electrode 104 and CTM electrode 108 include aluminum (Al), copper (Cu), tantalum (Ta), titanium (Ti), tantalum nitride (TaN), titanium nitride (TiN), tungsten (W), or combinations thereof. In various embodiments, the CBM protective sidewall regions 110C, 110D, and CTM protective sidewall regions 110A, 110B, include an oxide or nitride layer comprising Al, Cu, Ta, Ti, W, or combinations thereof.

In some embodiments, the CBM protective sidewall regions 110C, 110D (or the CTM protective sidewall regions 110A, 110B) have a width 122 ranging from 5 angstroms to 60 angstroms, as measured perpendicularly from the CBM vertical sidewall surfaces 120C, 120D. In some embodiments, the CBM and CTM electrodes 104, 108 can have a thickness or "height" in a range of about of approximately 500 angstroms to about 1,000 angstroms. In some embodiments, the thicknesses of CBM and CTM electrodes 104, 108 are different from one-another.

In some embodiments, the high k dielectric layer 106 extends continuously over the CBM electrode 104. As shown, the CTM electrode 108 overlies less than all of the CBM electrode 104, thereby giving the MIM capacitor 100 a "top-hat" shape in some regards.

The CBM electrode 104 is arranged over a first inter-metal dielectric (IMD) 102 within a back-end of line (BEOL) metallization stack. The high k dielectric layer 106 extends continuously over the CBM electrode 104, along the CBM vertical sidewall surfaces 120C, 120D and along portions of an IMD upper surface 124 that are not covered by the CBM electrode 104. An etch stop layer 112 conformally overlays the CTM electrode 108, portions of the CBM electrode 104 not covered by the CTM electrode 108, and the portions of an IMD upper surface 124 that are not covered by the CBM electrode 104. In some embodiments, the etch stop layer 112 comprises silicon nitride (SiN).

In some embodiments, the first and second contact vias 114A, 114B and the first and second metal lines 116A, 116B are formed by a dual-damascene process, wherein trenches are formed in a second IMD layer 118 and filled with a conductive material (e.g., Al, Cu, etc.). The first and second contact vias 114A, 114B form contacts to the CTM electrode 108 and the CBM electrode 104, respectively.

For various embodiments of a MIM capacitor formed in accordance with the present disclosure, protective sidewall regions are formed on both the CBM and CTM electrodes 104, 108, as illustrated in MIM capacitor 100A of FIG. 1A. However, the protective sidewall regions may be formed on the CBM electrode 104 only as illustrated in MIM capacitor 100B of FIG. 1B, or on the CTM electrode 108 only, as illustrated in MIM capacitor 100C of FIG. 1C.

Figure 2:
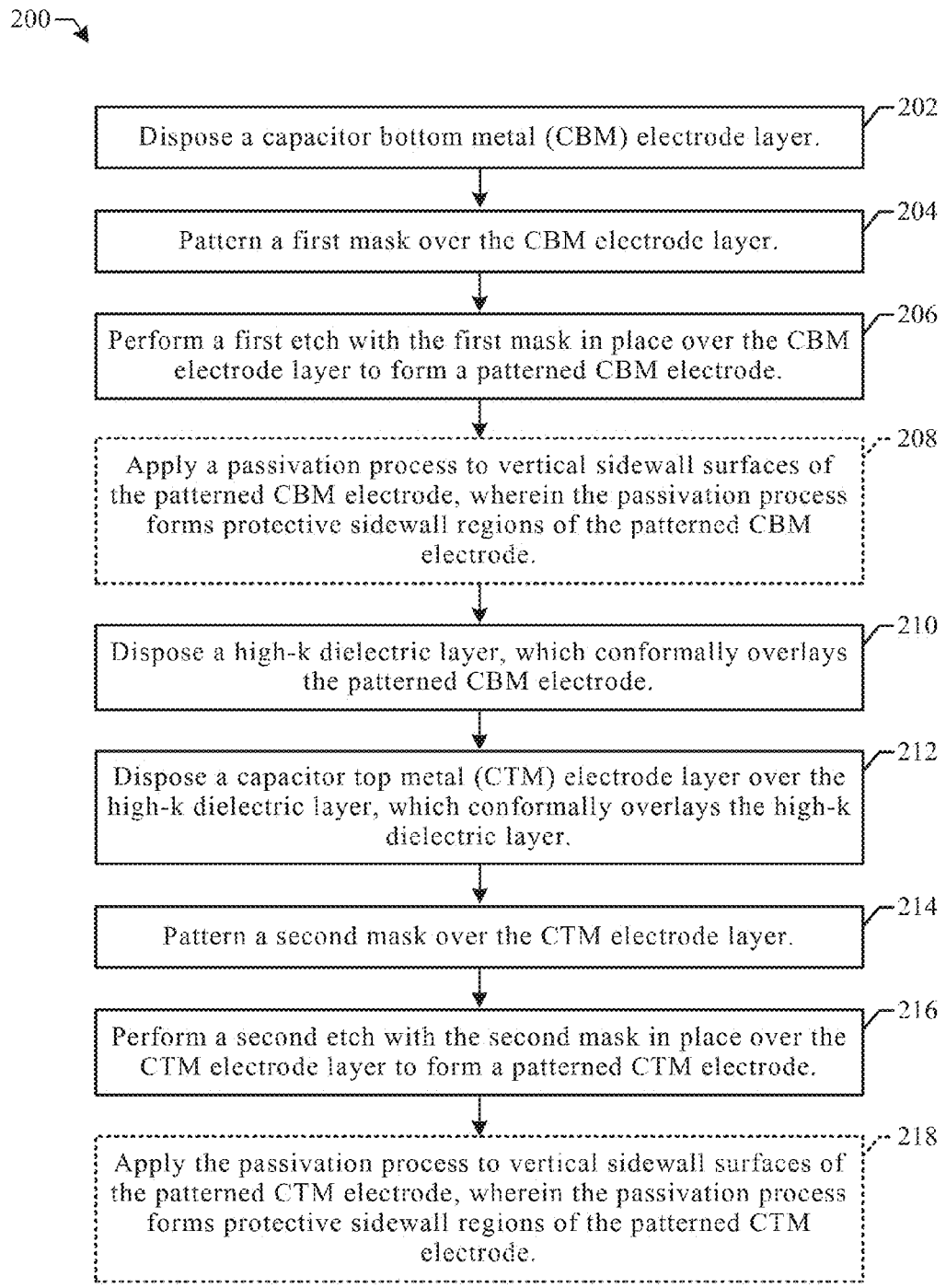
FIG. 2 illustrates a methodology for forming a MIM capacitor in flow chart format in accordance with some embodiments.

FIG. 2 illustrates a methodology 200 for forming the MIM capacitor 100A in flow chart format in accordance with some embodiments. A methodology for forming the MIM capacitors 100B-100C follows by analogy, with the omission of one or more steps. It will be appreciated that not all illustrated steps are necessarily required, and in other embodiments some of these steps may be omitted. Further, in other embodiments, additional process steps which are not illustrated herein may be present. Further still in other embodiments, the order of the illustrated processing steps can be re-arranged. All such embodiments are contemplated as falling with the scope of the present disclosure.

At 202 a capacitor bottom metal (CBM) electrode layer is disposed through physical vapor deposition (PVD), chemical vapor deposition (CVD), or other suitable layer growth process. In some embodiments, the CBM electrode layer is made of a first material that includes a metallic component (e.g., Al, Cu, Ta, Ti, W).

At 204 a first mask is patterned over the CBM electrode layer. In some embodiments, the first mask comprises a silicon nitride (SiN) hard mask disposed over the CBM electrode layer and patterned through one or more known photolithographic techniques.

At 206 a first etch is performed with the first mask in place over the CBM electrode layer to form a patterned CBM electrode from the CBM electrode layer. In some embodiments, the first etch comprises a wet or dry anisotropic etch.

Figure 1B:
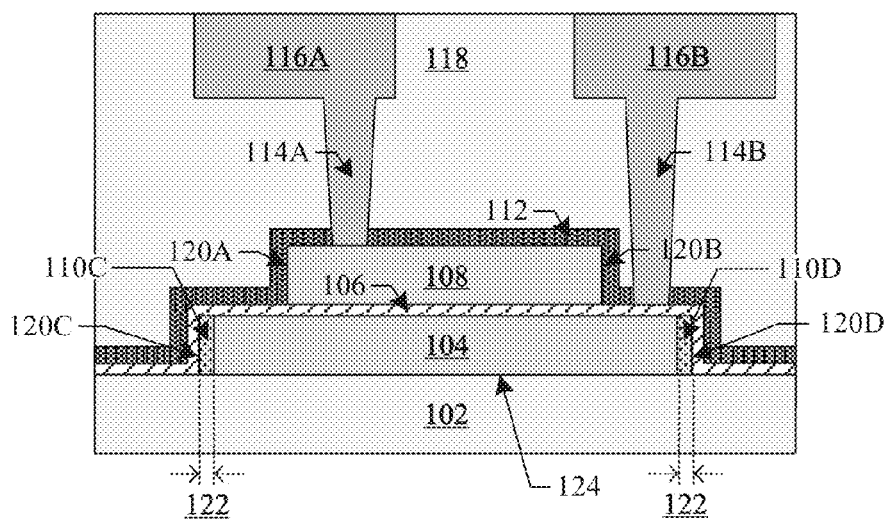
Figure 1C:
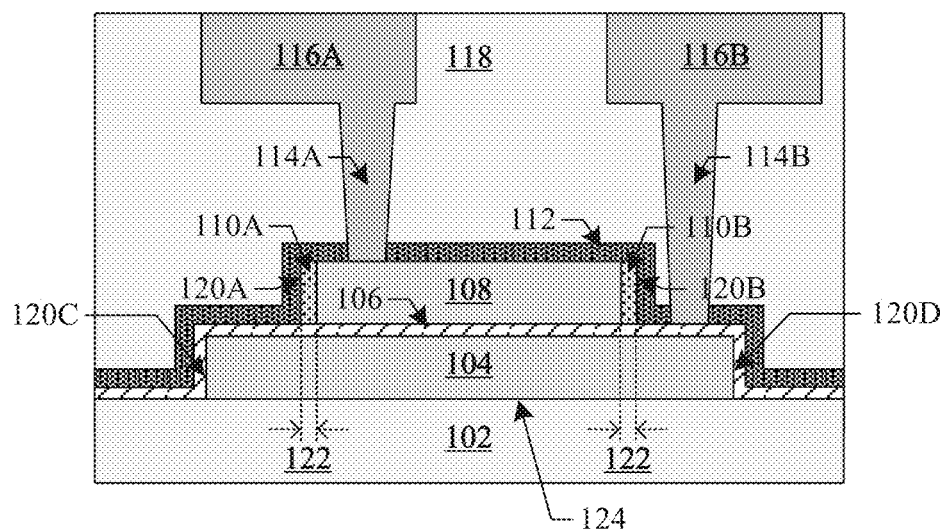

At 208 a passivation process is applied to CBM vertical sidewall surfaces. The passivation process forms CBM protective sidewall regions. The CBM protective sidewall regions are made of a second material that includes the metallic component and an oxide or a nitride component. In some embodiments, the metallic component comprises Al, Cu, Ta, Ti, W. In some embodiments, the passivation process comprises applying a carrier gas of hydrogen ($H_2$), oxygen ($O_2$), nitrogen ($N_2$), or nitrous oxide ($N_2O$), while simultaneously applying one or more metallic gas components (e.g., Ta, Ti, W, Al, or Cu), to the patterned CBM electrode. In some embodiments, the SiN hard mask remains over the CBM electrode during the passivation process so that an upper surface of the CBM electron remains unaffected by the passivation process. This step is omitted when forming MIM capacitor 100C, as illustrated in FIG. 1C.

At 210 a high k dielectric layer is disposed, which conformally overlays the patterned CBM electrode. In various embodiments, the high k dielectric layer 106 comprises aluminum oxide ($Al_2O_3$), hafnium oxide ($HfO_2$), silicon dioxide ($SiO_2$), silicon carbide (SiC), silicon nitride (SiN or $Si_3N_4$), tantalum pentoxide ($Ta_2O_5$), tantalum oxynitride (TaON), tantalum dioxide ($TiO_2$), zirconium dioxide ($ZrO_2$), tetraethosiloxane (TEOS), spin-on-glass ("SOG"), halogenated SiO, fluorinated silicate glass ("FSG"), and the like.

At 212 capacitor top metal (CTM) electrode layer is disposed over the high k dielectric layer through PVD, CVD, or other suitable layer growth process. The CTM electrode layer conformally overlays the high k dielectric layer. In various embodiments, the CTM electrode layer includes Al, Cu, Ta, Ti, TaN, TiN, or combinations thereof.

At 214 a second mask (e.g., SiN) is patterned over the CTM electrode layer using known photolithographic techniques.

At 216 a second etch is performed with the second mask in place over the CTM electrode layer to form a patterned CTM electrode.

At 218 the passivation process is applied to CTM vertical sidewall surfaces. The passivation process forms protective sidewall regions within the vertical sidewall surfaces (e.g., an oxide or nitride layer comprising Ta, Ti, W, Al, or Cu). This step is omitted when forming MIM capacitor 100B, as illustrated in FIG. 1B.

Turning now to FIGS. 3A-3I, one can see a series of cross-sectional views that collectively depict a manufacturing process for the MIM capacitor 100A in accordance with some embodiments. A manufacturing process for the MIM capacitors 100B-100C follows by analogy, with the omission of one of more steps, akin to the methodology 200.

Figure 3A:
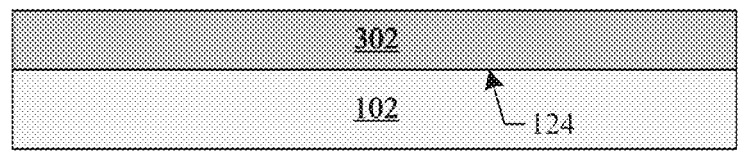
FIGS. 3A-3I are a series of cross-sectional views that collectively depict an embodiment for manufacturing an MIM capacitor in accordance with some embodiments.

In FIG. 3A, a CBM electrode layer 302 has been disposed over an upper surface 124 of a first inter-metal dielectric (IMD) 102. The CBM electrode layer 302 is arranged within the BEOL stack comprising a plurality of metallization layers, which are arranged over a substrate (not shown). The substrate includes various active and passive elements, the metallization layers of the BEOL stack, and inter-metal vias. The CBM electrode layer 302 is formed on one of the metallization layers. In one exemplary non-limiting embodiment, metal_0-metal_3 metallization layers of a BEOL stack are formed over the substrate, and the CBM electrode layer is formed on a metal_4 metallization layer of the BEOL stack.

In various embodiments, the CBM electrode layer 302 comprises copper (Cu), aluminum (Al), tantalum (Ta), tantalum nitride (TaN), titanium (Ti), titanium nitride (TiN), or combinations thereof. In one non-limiting exemplary embodiment, the CBM electrode layer 302 comprises Cu, which is surrounded by a barrier/adhesion layer of Ta, TaN, Ti, or TiN. In some embodiments, the CBM electrode layer 302 has been disposed by PVD; a CVD process such as low pressure CVD (LPCVD), atomic layer CVD (ALCVD), ultrahigh vacuum CVD (UHVCVD), reduced pressure CVD (RPCVD); molecular beam epitaxy (MBE) processes; any suitable epitaxial process; or any combinations thereof. In some embodiments, excess CBM material is then polished off and planarized by chemical mechanical polishing (CMP).

Figure 3B:
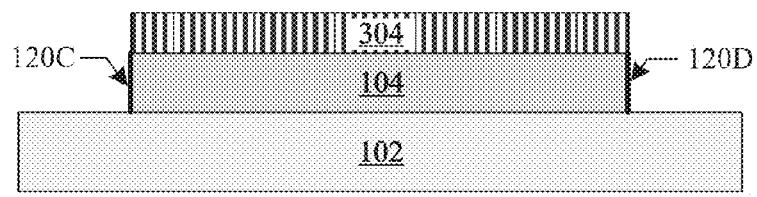

In FIG. 3B, a first mask 304 (e.g., a SiN hard mask) has been patterned over the CBM electrode layer 302 using known photolithographic techniques with an appropriate photolithographic mask. A photoresist layer (not shown) is typically spin-coated over the CBM electrode layer 302, exposed to radiation (e.g., light), and developed to form a pattern corresponding to the first mask 304. For the embodiments of FIG. 3B, the photoresist layer can have a positive tone, wherein exposed portions become soluble to a chemical developer used in the developing step. In other embodiments, the photoresist layer can have a negative tone, wherein the exposed portions become insoluble to the chemical developer. The exposed portions of the CBM electrode layer 302 are then removed using a first etch with the first mask 304 in place over the CBM electrode layer 302, to form the CBM electrode 104. In some embodiments the first etch comprises a dry etch, further comprising exposing the first mask 304 and the CBM electrode layer 302 to a plasma of reactive gases such as oxygen, chlorine, fluorine, carbon, boron, and the like. In some instances, the first etch results in a formation of metallic residue or etch damage to CBM vertical sidewall surfaces 120C, 120D, which can subject the MIM capacitor 100A to failure modes due to leakage, premature voltage breakdown, or burn out.

Figure 3C:
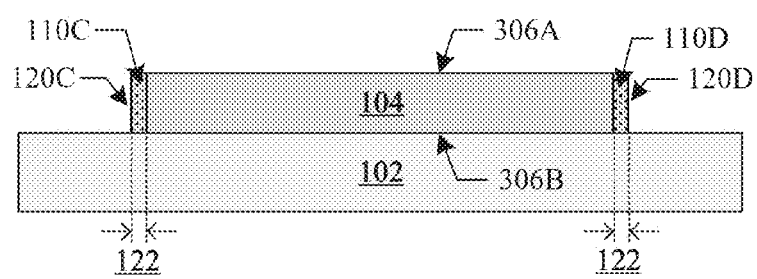

In FIG. 3C, a passivation process has been applied to the patterned CBM electrode 104. The passivation process has formed CBM protective sidewall regions 110C, 110D to remove the metallic residue, or to repair the etch damage. In some embodiments, the passivation process comprises exposing the CBM electrode 104 to a plasma of one or more carrier gas(es) such as hydrogen ($H_2$), oxygen ($O_2$), nitrogen ($N_2$), or nitrous oxide ($N_2O$), and metallic gas components such as tantalum (Ta), titanium (Ti), tungsten (W), aluminum (Al), or copper (Cu). In other embodiments, the passivation process comprises subjecting the CBM electrode 104 to a thermal process while exposing the CBM electrode 104 to the carrier and metallic gases. In some embodiments, the thermal process is performed in situ at a temperature in a range between 300° C. and 450° C. The carrier and metallic gases thereby form the CBM protective sidewall regions 110C, 110D, which comprise an oxide or nitride layer, with a width 122 ranging from 5 angstroms to 60 angstroms.

The CBM protective sidewall regions 110C, 110D extend along the CBM vertical sidewall surfaces 120C, 120D between a CBM electrode upper surface 306A and a CBM electrode lower surface 306B. In some embodiments, the first mask 304 is left in place over the patterned CBM electrode 104 during passivation to prevent oxidation or nitridation of the CBM electrode upper surface 306A, which could otherwise increase contact resistance to the CBM electrode upper surface 306A. In other embodiments, the first mask 304 can be remove from over the patterned CBM electrode 104 prior to the passivation, such that the oxide or nitride forms over the entire exposed surface of the patterned CBM electrode 104, including the CBM vertical sidewall surfaces 120C, 120D and the CBM electrode upper surface 306A. Oxide or nitride formed on the CBM electrode upper surface 306A can then be removed by a CMP process or anisotropic etch, to form the resultant structure of FIG. 3C.

Figure 3D:
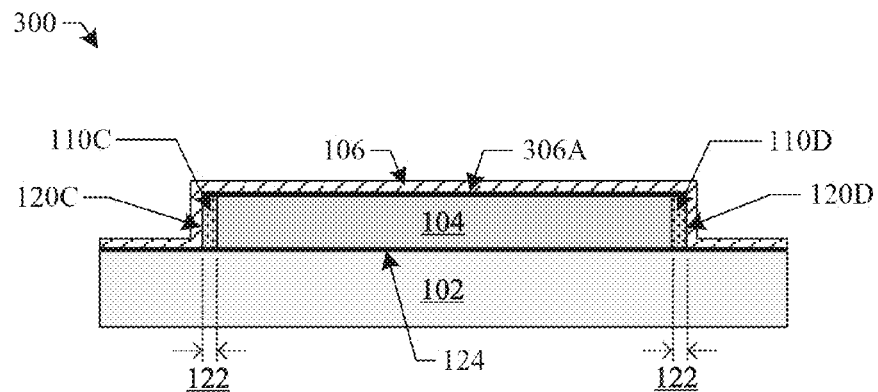

In FIG. 3D, a high k dielectric layer 106 has been disposed, which conformally overlays the CBM electrode upper surface 306A, the CBM protective sidewall regions 110C, 110D, and portions of an IMD upper surface 124 that are not covered by the CBM electrode 104. In various embodiments, the high k dielectric layer comprises $Al_2O_3$, $HfO_2$, $SiO_2$, SiC, SiN or $Si_3N_4$, $Ta_2O_5$, TaON, $TiO_2$, $ZrO_2$, TEOS, SOG, halogenated SiO, FSG, and the like. In various embodiments, the high k dielectric layer 106 has been deposited by spin-on techniques, electro-chemical plating, PVD, CVD or some variant, atomic layer deposition (ALD), molecular beam epitaxy (MBE), and the like. For example, in one exemplary non-limiting embodiment, a high k dielectric layer 106 comprising $SiO_2$ is disposed using a CVD process that uses tetraethosiloxane (TEOS) or TEOS/ozone as the reactant gas.

Figure 3E:
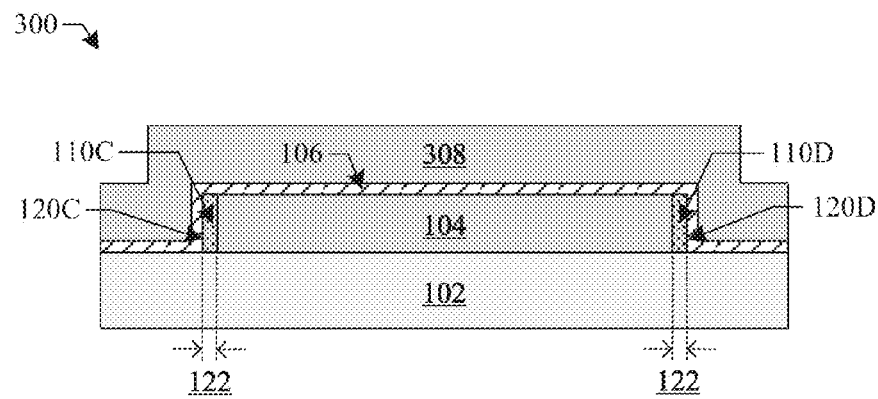

In FIG. 3E, a CTM electrode layer 308 has been disposed over the high k dielectric layer 106, which conformally overlays the high k dielectric layer 106. In various embodiments, the CTM electrode layer 308 comprises Al, Ta, TaN, Ti, TiN, or combinations thereof. In some embodiments, the CBM electrode layer 302 comprises a tri-layer metal structure of TiN/Al/TiN or TiN/AlCu/TiN. In some embodiments, the CBM electrode layer 302 has been disposed by PVD, CVD, MBE, and the like. In some embodiments, excess CTM material is then planarized by CMP, thereby forming the CTM electrode layer 308.

Figure 3F:
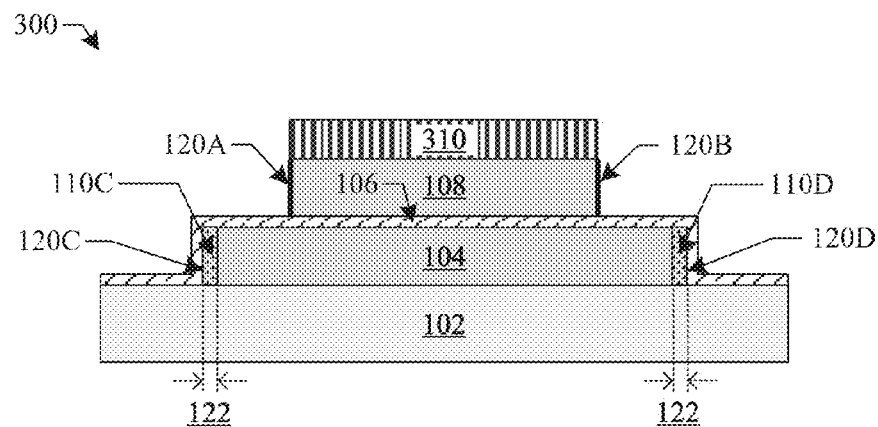

In FIG. 3F, a second mask 310 (e.g., SiN) has been patterned over the CTM electrode layer 308 using known photolithographic techniques, and a second etch has been performed with the second mask 310 in place over the CTM electrode layer 308 to form the CTM electrode 108. In some embodiments the second etch comprises a dry etch (e.g., a plasma of oxygen, chlorine, fluorine, carbon, boron, etc,), which has removed portions of the CTM electrode layer 308 that are not covered by the second mask 310. In some instances, the second etch introduces metallic residue or etch damage to CTM vertical sidewall surfaces 120A, 120B, which again can subject the MIM capacitor 100A to failure modes due to leakage, premature voltage breakdown, or burn out.

Figure 3G:
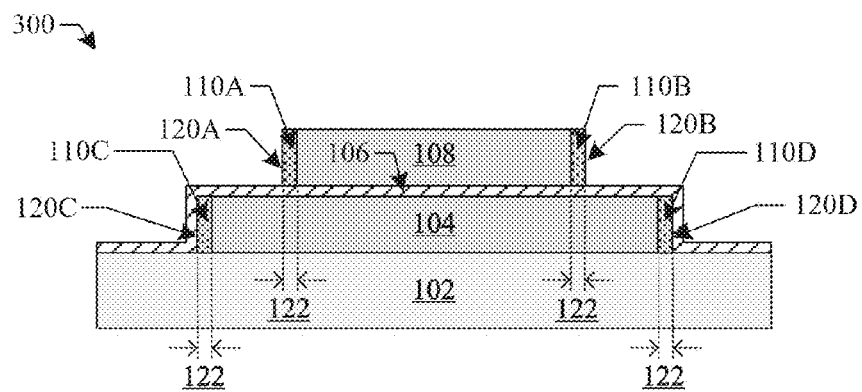

In FIG. 3G, the passivation process has been applied to the patterned CTM electrode 108, which has formed CTM protective sidewall regions 110A, 110B to remove the metallic residue, or to repair the etch damage. In some embodiments, the passivation process comprises exposing the CBM electrode 104 to a plasma of carrier gas (e.g., $H_2$, $O_2$, $N_2$, $N_2O$, etc.) and metallic gas components (e.g., Ta, Ti, W, Al, Cu, etc.). In some embodiments, the CTM protective sidewall regions 110A, 110B have a width 122 ranging from 5 angstroms to 60 angstroms. In various embodiments, the passivation process of FIG. 3G can be the same as, or different than, the passivation process of FIG. 3C, in terms of a partial pressure of the carrier gas, a partial pressure of the metallic gas components, the composition of the carrier gas, the composition of the metallic gas components, or combinations thereof. Consequently, the CTM protective sidewall regions 110A, 110B and CBM protective sidewall regions 110C, 110D may have the same or different composition, or the same or different widths.

Figure 3H:
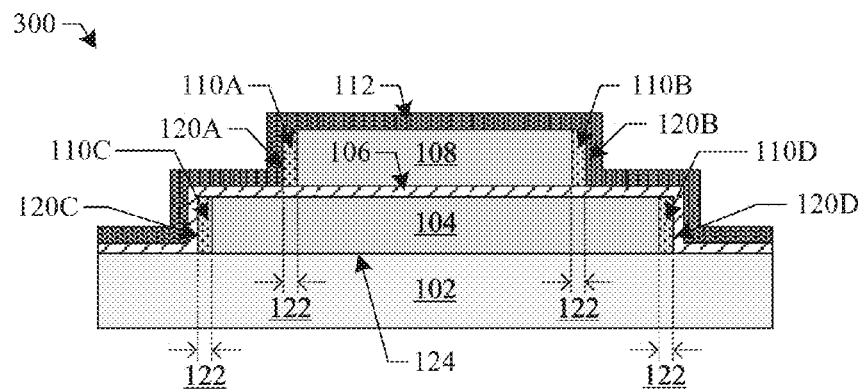

In FIG. 3H, an etch stop layer 112 (e.g., SiN) has been disposed through a CVD process such as high-density plasma CVD (HDPCVD), or other appropriate process(es). The etch stop layer 112 conformally overlays the CTM electrode 108, the CTM protective sidewall regions 110A, 110B, portions of the CBM electrode 104 not covered by the CTM electrode 108, the CBM protective sidewall regions 110C, 110D, and the portions of an IMD upper surface 124 that is not covered by the CBM electrode 104. The etch stop layer 112 prevents damage to the CBM and CTM electrodes 104, 108 during a contact etch performed in FIG. 3I.

Figure 3I:
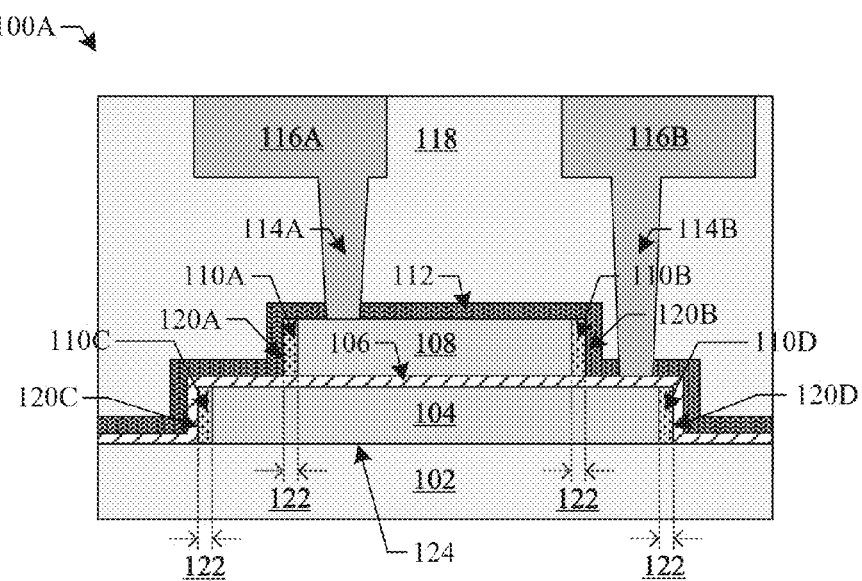

In FIG. 3I, a second IMD layer 118 had been disposed through a CVD process such as plasma-enhanced CVD (PECVD), or other appropriate process. In some embodiments, an anti-reflective coating (ARC) layer (not shown) is disposed over the etch stop layer 112, prior to disposing the second IMD layer 118, using conventional materials and deposition processes. The ARC layer helps to prevent image distortion near the CTM vertical sidewall surfaces 120A, 120B in subsequent photolithographic steps. After disposal, the second IMD layer 118 has been planarized through a CMP or other planarization process. First and second contact vias 114A, 114B have been formed between the CTM and CBM electrodes 108, 104, and first and second metal lines 116A, 116B, respectively. Upon formation of the first and second contact vias 114A, 114B and the first and second metal lines 116A, 116B, the MIM capacitor 100A is thereby formed.

In some embodiments, the first and second contact vias 114A, 114B and the first and second metal lines 116A, 116B are formed by one or more photolithography process(es), wherein the second IMD layer 118 is coated with a photoresist layer, exposed to radiation, and developed to form a pattern within the photoresist layer. The pattern is then etched through the exposed portions of the photoresist layer to form trenches in the second IMD layer 118. In some embodiments, the pattern is etched anisotropically using known etching techniques such as sputter etching, ion-beam etching, plasma etching, and the like. Other techniques can also be employed. After the etch, the photoresist layer is removed using conventional techniques, such as stripping, ashing and the like. The trenched are the filled with a conductive material (e.g., Cu) to form the first and second contact vias 114A, 114B and the first and second metal lines 116A, 116B.

In a non-limiting exemplary embodiment of a via first dual-damascene process, first trenches are formed for the first and second contact vias 114A, 114B by a first photolithography process, and second trenches are formed for the first and second metal lines 116A, 116B by a second photolithography process. The first and second trenches are then filled with a conductive material (e.g., Cu, Al, etc.) in a single fill step.

In some embodiments of a CBM electrode layer 302 comprising Cu and a second IMD layer 118 comprising silicon dioxide ($SiO_2$), a buffer layer (e.g., TiN, TaN, Ta, or Ti) is disposed over the CBM electrode layer 202 prior to forming the first mask 304. The buffer layer prevents the underlying Cu from direct contact with the $SiO_2$ that would cause Cu corrosion due to interaction with the oxide. However, for other embodiments such as a second IMD layer 118 comprising SiN, the insulating protecting buffer layer is not needed.

It is also noted that the present disclosure presents embodiments in the form of a MIM capacitor, which may be included in back end of line (BEOL) metallization stack of a manufactured integrated circuit (IC) such as a microprocessor, memory device, and/or other IC. The IC may also include various passive and active microelectronic devices, such as resistors, capacitors (e.g., DT capacitors), inductors, diodes, metal-oxide-semiconductor field effect transistors (MOSFETs), complementary MOS (CMOS) transistors, bipolar junction transistors (BJTs), high power MOS transistors such as laterally diffused MOS (LDMOS) transistors, or other types of transistors. One of ordinary skill may recognize other embodiments of semiconductor devices that may benefit from aspects of the present disclosure.

The integrated circuit (IC) is arranged on a substrate, which may be a silicon substrate. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate is a semiconductor on insulator (SOI).

Some embodiments relate to a metal-insulator-metal (MIM) capacitor. The MIM capacitor includes a capacitor a capacitor bottom metal (CBM) electrode, a high k dielectric layer arranged over the CBM electrode, and a capacitor top metal (CTM) electrode arranged over the high k dielectric layer. The MIM capacitor further comprises CBM and CTM protective sidewall regions, which extend along CBM and CTM vertical sidewall surfaces, respectively.

Other embodiments relate to a metal-insulator-metal (MIM) capacitor, comprising a capacitor bottom metal (CBM) electrode, a high k dielectric layer arranged over the CBM electrode, and a capacitor top metal (CTM) electrode arranged over the high k dielectric layer. The MIM capacitor further comprises protective sidewall regions of the CBM electrode, which extend along CBM vertical sidewall surfaces.

Yet other embodiments relate to method of forming a metal-insulator-metal (MIM) capacitor stack, comprising disposing a capacitor bottom metal (CBM) electrode layer, patterning a first mask over the CBM electrode layer, and performing a first etch with the first mask in place over the CBM electrode layer to form a patterned CBM electrode. The method further comprises applying a passivation process to CBM vertical sidewall surfaces, wherein the passivation process forms CBM protective sidewall regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor, comprising:
    a capacitor bottom metal (CBM) electrode;
    a high k dielectric layer arranged over the CBM electrode;
    a capacitor top metal (CTM) electrode arranged over the high k dielectric layer; and
    CTM protective sidewall regions, which extend along sidewall surfaces of the CTM electrode, wherein top and bottom surfaces of the CTM electrode are substantially aligned with top and bottom surfaces of the CTM protective sidewall regions.

2. The MIM capacitor of claim 1, wherein the CTM electrode includes a metallic component, and wherein the CTM protective sidewall regions include an oxide or nitride compound of the metallic component that directly contacts the CTM electrode.

3. The MIM capacitor of claim 1, further comprising CBM protective sidewall regions, which extend along sidewall surfaces of the CBM electrode.

4. The MIM capacitor of claim 3, wherein the CBM protective sidewall regions comprise:
tantalum (Ta), titanium (Ti), tungsten (W), aluminum (Al), or copper (Cu); and
oxygen or nitrogen.

5. The MIM capacitor of claim 3, wherein the CBM protective sidewall regions have a width ranging from 5 angstroms to 60 angstroms, as measured perpendicularly from the sidewall surfaces of the CBM electrode.

6. The MIM capacitor of claim 3, wherein the high k dielectric layer extends vertically between the CTM protective sidewall regions and the CBM protective sidewall regions.

7. The MIM capacitor of claim 1, wherein the high k dielectric layer extends continuously over the CBM electrode, and wherein the CTM electrode overlies less than all of the CBM electrode.

8. The MIM capacitor of claim 7, further comprising an etch stop layer conformally overlaying the CTM electrode, the CTM protective sidewall regions, and portions of the high k dielectric layer that are not covered by the CTM electrode.

9. The MIM capacitor of claim 1, wherein the CTM protective sidewall regions have a height that is substantially equal to a height of the CTM electrode.

10. The MIM capacitor of claim 1, wherein the high k dielectric layer has a single planar upper surface that contacts lower surfaces of the CTM electrode and the CTM protective sidewall regions.

11. A metal-insulator-metal (MIM) capacitor, comprising:
a capacitor bottom metal (CBM) electrode;
a high k dielectric layer arranged over the CBM electrode;
a capacitor top metal (CTM) electrode arranged over the high k dielectric layer; and
CBM protective sidewall regions, which extend along sidewall surfaces of the CBM electrode, wherein an upper surface of the CBM protective sidewall regions contacts a lower surface of the high k dielectric layer.

12. The MIM capacitor of claim 11, wherein the CBM electrode includes a metallic component, and the CBM protective sidewall regions include an oxide or nitride compound of the metallic component that laterally contacts the CBM electrode.

13. The MIM capacitor of claim 11, wherein the CBM protective sidewall regions have a width ranging from 5 angstroms to 60 angstroms, as measured perpendicularly from the sidewall surfaces of the CBM electrode.

14. The MIM capacitor of claim 11, wherein the high k dielectric layer vertically and laterally contacts the CBM protective sidewall regions.

15. The MIM capacitor of claim 11, wherein the high k dielectric layer has a lower surface that is aligned with a lower surface of the CBM electrode and an upper surface that overlies the CBM electrode.

16. A method of forming a metal-insulator-metal (MIM) capacitor stack, comprising:
disposing a capacitor bottom metal (CBM) electrode layer;
patterning a first mask over the CBM electrode layer;
performing a first etch with the first mask in place over the CBM electrode layer to form a patterned CBM electrode; and
applying a passivation process to CBM vertical sidewall surfaces, wherein the passivation process forms CBM protective sidewall regions.

17. The method of claim 16, further comprising:
disposing a high k dielectric layer, which conformally overlays the patterned CBM electrode;
disposing a capacitor top metal (CTM) electrode layer over the high k dielectric layer, which conformally overlays the high k dielectric layer;
patterning a second mask over the CTM electrode layer;
performing a second etch with the second mask in place over the CTM electrode layer to form a patterned CTM electrode; and
applying the passivation process to CTM vertical sidewall surfaces, wherein the passivation process forms CTM protective sidewall regions of the CTM electrode.

18. The method of claim 17, wherein the passivation process comprises applying a hydrogen ($H_2$), oxygen ($O_2$), nitrogen ($N_2$), or nitrous oxide ($N_2O$) treatment to the patterned CBM electrode or the patterned CTM electrode.

19. The method of claim 17, wherein the passivation process comprises applying tantalum (Ta), titanium (Ti), tungsten (W), aluminum (Al), or copper (Cu) to the patterned CBM electrode or the patterned CTM electrode.

20. The method of claim 17,
wherein the CBM electrode layer or the CTM electrode layer is made of a first material that includes a metallic component; and
wherein the CBM protective sidewall regions or the patterned CTM electrode are made of a second material that includes the metallic component and an oxide or a nitride component.

* * * * *